United States Patent
Kinnard et al.

(10) Patent No.: US 7,163,587 B2
(45) Date of Patent: Jan. 16, 2007

(54) REACTOR ASSEMBLY AND PROCESSING METHOD

(75) Inventors: David William Kinnard, Olney, MD (US); David Ferris, Rockville, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/071,908

(22) Filed: Feb. 8, 2002

(65) Prior Publication Data

US 2003/0150560 A1 Aug. 14, 2003

(51) Int. Cl.
C23C 16/48 (2006.01)
C23F 1/10 (2006.01)
H01L 21/306 (2006.01)
C23C 16/52 (2006.01)
C23F 1/00 (2006.01)

(52) U.S. Cl. ............... 118/724; 118/641; 118/715; 156/345.37; 156/345.33

(58) Field of Classification Search ........... 118/715, 118/719, 725, 730, 724, 641; 156/345.33, 156/345.37
See application file for complete search history.

(56) References Cited

U.S. PATENT DOCUMENTS

| | | | | |
|---|---|---|---|---|
| 4,839,145 A * | 6/1989 | Gale et al. | ............... | 118/725 |
| 4,846,102 A * | 7/1989 | Ozias | ............... | 118/730 |
| 4,993,360 A * | 2/1991 | Nakamura | ............... | 118/719 |
| 5,044,315 A * | 9/1991 | Ozias | ............... | 427/248.1 |
| 5,077,875 A * | 1/1992 | Hoke et al. | ............... | 118/730 |
| 5,190,592 A * | 3/1993 | Chazee | ............... | 118/719 |
| 5,228,501 A * | 7/1993 | Tepman et al. | ............... | 165/80.1 |
| 5,244,694 A * | 9/1993 | Ozias | ............... | 427/248.1 |
| 5,261,960 A * | 11/1993 | Ozias | ............... | 118/719 |
| 5,288,327 A * | 2/1994 | Bhat | ............... | 118/719 |
| 5,304,247 A * | 4/1994 | Kondo et al. | ............... | 118/715 |
| 5,370,738 A * | 12/1994 | Watanabe et al. | ............... | 118/725 |
| 5,405,446 A * | 4/1995 | Nakajima et al. | ............... | 118/719 |
| 5,441,568 A | 8/1995 | Cho et al. | ............... | 118/715 |
| 5,685,906 A * | 11/1997 | Dietze et al. | ............... | 117/101 |
| 6,093,252 A * | 7/2000 | Wengert et al. | ............... | 118/719 |
| 6,143,079 A * | 11/2000 | Halpin | ............... | 118/715 |
| 6,185,839 B1 | 2/2001 | Kholodenko et al. | ............... | 34/255 |
| 6,254,933 B1 * | 7/2001 | Habuka et al. | ............... | 427/248.1 |
| 6,325,858 B1 | 12/2001 | Wengert et al. | ............... | 118/725 |
| 6,355,108 B1 * | 3/2002 | Won et al. | ............... | 118/728 |
| 6,383,330 B1 * | 5/2002 | Raaijmakers | ............... | 118/715 |
| 6,464,792 B1 * | 10/2002 | Wengert et al. | ............... | 118/715 |
| 6,583,638 B1 * | 6/2003 | Costello et al. | ............... | 324/760 |

FOREIGN PATENT DOCUMENTS

JP 02-152251 * 6/1990

* cited by examiner

*Primary Examiner*—Rudy Zervigon
(74) *Attorney, Agent, or Firm*—Cantor Colburn LLP

(57) ABSTRACT

A reactor assembly and processing method for treating a substrate generally includes a base unit, a chuck assembly, a process chamber, an inlet manifold assembly and an exit manifold assembly. The inlet manifold assembly is in fluid communication with a first opening of the process chamber, wherein the inlet manifold assembly comprises a flow-shaping portion adapted to laterally elongate a gas and/or a reactant flow into the process chamber. The exhaust manifold assembly in fluid communication with a second opening of the process chamber and is diametrically opposed to the inlet manifold assembly. The process includes flowing a gas and/or reactive species into the process chamber of the reactor assembly in a direction that is about planar with the substrate surface providing improved uniformity and increased reactivity.

25 Claims, 12 Drawing Sheets

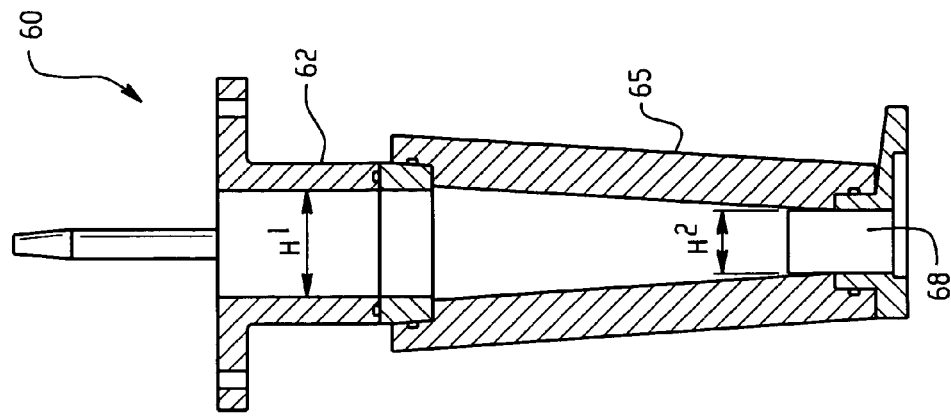
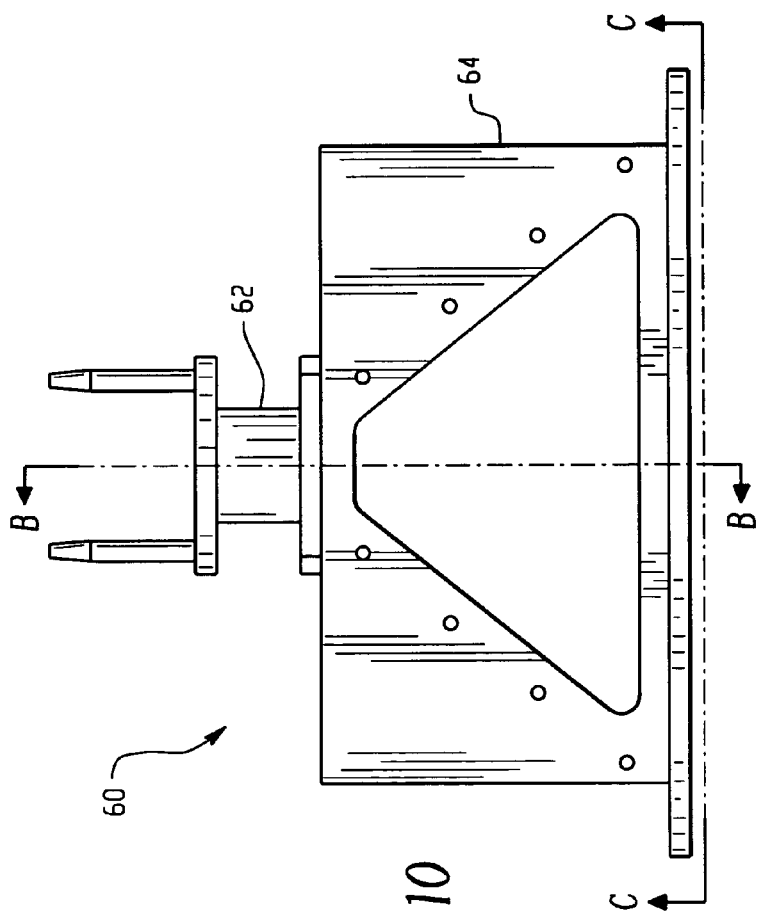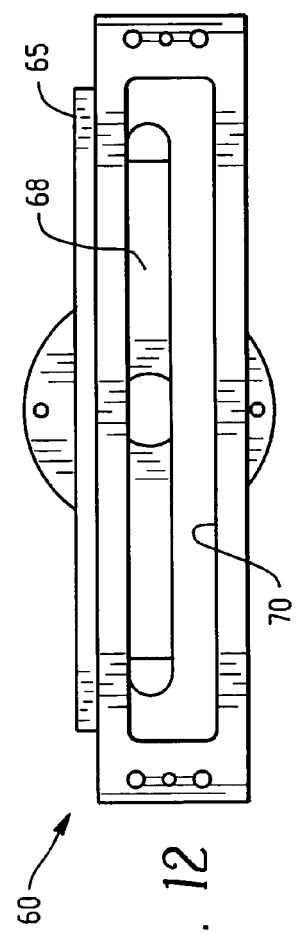

REACTOR ASSEMBLY AND PROCESSING METHOD

BACKGROUND OF THE INVENTION

The present disclosure relates to a reactor assembly for processing substrates and more particularly, to a distribution system for flowing gases and/or reactants into and out of the reactor assembly.

In many semiconductor fabrication processes, process gas is introduced into a process chamber of a reactor assembly through a gas distributor. Plasma may be formed from the gas to etch features on the substrate, deposit layers of material on the substrate, and the like. Gaseous byproducts formed during processing are exhausted from the process chamber via an exhaust system. In etching processes, the uniformity of the shape and size of features across the substrate is affected by the distribution of gaseous species across the substrate, especially when the size and spacing of the etched features become smaller. Similarly, in deposition processes, the thickness and composition of the deposited layer can vary across the surface of the substrate depending upon the distribution of gaseous species across the surface of the substrate.

Axial flow reactor assemblies often fail to provide a uniform distribution of gas and/or reactive gaseous species across the substrate resulting in variations in the shape and size of the etched features, the thickness of the deposited layer, or the like. Axial flow reactor assemblies typically include axisymmetric gas inlets located above and coaxial to the substrate, i.e., directly above the substrate to be processed. Consequently, the gas and/or reactant flow is normal to the substrate surface creating a subsequent radial flow pattern that is generally transverse to the substrate surface. This can lead to flow anomalies and non-uniformity in exposure of the gas and/or reactant to the substrate surface as effluent from the process on the substrate surface combines with the incoming gas flow.

Gas distribution systems placed upstream of the substrate have been employed with process chambers in an attempt to minimize the non-uniformity. Gas distribution systems typically include the use of specialized plates that are difficult to predict analytically and are largely designed by trial and error experimental methods. For example, the use of special baffle plates have been employed and are typically positioned in close proximity to the gas inlet in an attempt to improve uniformity of gas and/or reactive species distribution at the substrate surface. However, one problem with the use of baffle plates and/or gas distribution plates disposed upstream from the substrate is the potential for reactive species recombination. The additional surfaces provided by these plates adjacent to the flow of process gases provide a large surface area that can contribute to reactive species recombination. The recombination of reactive species can decrease the overall efficiency of the process, thereby increasing process times and reducing throughput. To avoid reactive species recombination, the baffle plates and/or gas distribution plates disposed at or near the gas inlet require the use of special materials inert to the operating environment such as quartz, alumina, other ceramics, specialized aluminum alloys with non-reactive coatings such as hard anodization, and the like. The use of these materials adds to the overall costs and complexity of the reactor assembly. Moreover, some special alloys such as aluminum based alloys typically use special cooling modifications incorporated within the baffle plate itself or added as an additional device to prevent heating of the baffle plate, gas distribution plate by the substrate, and/or the high temperature plasma gas. The heating of the baffle plate can cause loss of substrate temperature control within the process chamber as each subsequent substrate is now heated by the energy contained within the baffle plate and not by the chamber heating device, i.e., lamp array, heated chuck, or the like. The use of the baffle plate and/or gas distribution plate also increases the internal volume of the process chamber requiring an increase in the external dimensions, particularly if a cooling device or cooling process is employed. In addition, the increased volume increases gas residence time that can be counterproductive in a process that is not reaction rate limited, e.g., a bulk photoresist stripping process, resulting in increased processing times.

The distribution of gas across the substrate can also be improved by supplying the gas through a plurality of nozzles that extend through the ceiling or walls of the process chamber. However, process chambers having ceramic walls or ceramic ceilings are difficult to fabricate with nozzle feedthroughs extending therethrough. Ceramic walls of polycrystalline ceramic material, such as aluminum oxide or silicon, are brittle materials and it is difficult to machine feedthrough holes in these materials without breaking or otherwise damaging the ceramic. Also, other components, such as RF induction coils, which are typically located adjacent to the ceramic walls further reduce the available space for locating a gas nozzle through the ceramic walls without increasing the overall size (height) of the reactor assembly. Thus, there is a need for a process chamber having a gas distribution system that provides a uniform distribution of gas in the process chamber without requiring an excessive number of feedthroughs to be machined through chamber walls or the addition of a gas distribution mechanism and cooling hardware, if present, between the reactor gas inlet and the substrate surface.

The distribution of gas into the process chamber is also affected by the position and symmetry of the exhaust conduit, i.e., gas outlet. An axisymmetrically positioned exhaust conduit can result in asymmetric flow rates of gas across the substrate surface causing non-uniformity. Furthermore, as substrates increase in diameter to 300 mm and beyond, the corresponding increases in the volume of the process chamber and surface area of the substrate makes it even more difficult to provide a uniform distribution of process gas across the entire surface of the substrate.

Another problem arises when a portion of the gas distributor is made from metal and is located within the energized plasma sheath in the process chamber. The metal component causes localized energy perturbations that can lead to variations in plasma energy across the face of the substrate. In addition, the plasma species often chemically erode the metal to form contaminant particles that deposit upon the substrate. For example, an aluminum gas distributor is rapidly eroded by a halogen containing plasma. Thus, it is generally required for the metal portions of the gas distributor to be protected from erosion by adding a ceramic coating to the metal surface, thereby adding to the expense and complexity of the reactor assembly. In addition, the plates need to be electrically isolated from the plasma to provide a more uniform plasma distribution. This method of gas distribution can add considerable cost to the reactor in both materials and engineering time required to solve these problems.

SUMMARY OF THE INVENTION

A reactor assembly comprising a base unit; a chuck assembly disposed in a cavity of the base unit, wherein the chuck assembly comprises a support having a surface capable of receiving a substrate; a process chamber comprising a top wall, a bottom wall, and sidewalls extending therefrom, wherein the process chamber is coupled to the base unit; an inlet manifold assembly in fluid communication with a first opening of the process chamber in a selected one of the sidewalls, wherein the inlet manifold assembly comprises a flow-shaping portion adapted to laterally elongate a gas and/or a reactant flow into the process chamber; and an exhaust manifold assembly in fluid communication with a second opening of the process chamber in the sidewall diametrically opposed from the selected one of the sidewalls.

An inlet manifold assembly suitable for use in the reactor assembly comprises an inlet end portion comprising a cylindrically shaped conduit; and a flow-shaping portion comprising a first end opening in fluid communication with the inlet end portion and a second end opening, wherein a width of the flow-shaping portion increases from the first end opening to the second end opening and is effective to laterally elongate a fluid flowing from the inlet end portion through the flow-shaping portion.

A process for flowing a gas and/or reactive species through a process chamber, the process comprising laterally elongating a laminar flow of the gas and/or reactive species into the process chamber at about a plane parallel to a surface of a substrate; and exhausting the flow of the gas and/or reactive species out of the process chamber at about the plane parallel to the surface of the substrate.

The above described and other features are exemplified by the following figures and detailed description.

BRIEF DESCRIPTION OF THE DRAWINGS

Referring to the exemplary drawings wherein like elements are numbered alike in the several Figures:

FIG. 10 is a top plan view of the inlet manifold assembly;

FIG. 11 is a cross sectional view of the inlet manifold assembly taken along lines B—B of FIG. 10;

FIG. 12 is a side elevation view of the inlet manifold assembly taken along lines C—C of FIG. 10;

DETAILED DESCRIPTION OF THE PREFERRED EMBODIMENTS

Disclosed herein is a reactor assembly and processing method for uniformly flowing a gas and/or reactive species across a substrate surface. The gas and/or reactive species flow across the substrate surface in a laminar flow pattern substantially parallel to a plane defined by the surface. The resulting flow pattern uniformly exposes the substrate surface to the gas and/or reactive species. The reactor assembly employs a relatively small process chamber volume compared to prior art process chambers; the use of which reduces residence time of the reactive species and increases reaction rates. The reactor assembly and processing method may be employed for plasma ashing or etching operations, CVD, or the like, wherein improved gas and/or reactant flow uniformity across the substrate surface is desired. Applicable reactor assemblies for plasma ashing and etching applications include those utilized for downstream processing as well as those employed in ICP, CCP and diode type etching processes.

The composition of the gases employed to generate the reactive species in the reactor assembly depends upon whether material is being deposited onto the substrate by chemical or physical vapor deposition, material is being etched from the substrate, or contaminant deposits are being cleaned from process chamber walls and other components disposed within the reactor assembly. For example, typical gases for depositing $SiO_2$ on a substrate include silicon source gases, such as $SiH_4$ or $SiCl_2H_2$, and oxygen source gas, such as $O_2$; or gases containing both silicon and oxygen such as $Si(OC_2H_5)_4$. As another example, gases for depositing $Si_3N_4$ include $SiH_4$ and $NH_3$ or $N_2$. Typical etching gases include $BCl_3$, $Cl_2$, $HCl$, $SF_6$, $CF_4$, and $CHF_3$. Physical vapor deposition processes use non-reactive gases, such as argon, or mixtures of non-reactive and reactive gases. The reactor assembly and processing method are not intended to be limited to any particular gases and/or reactive species.

Figure 1:
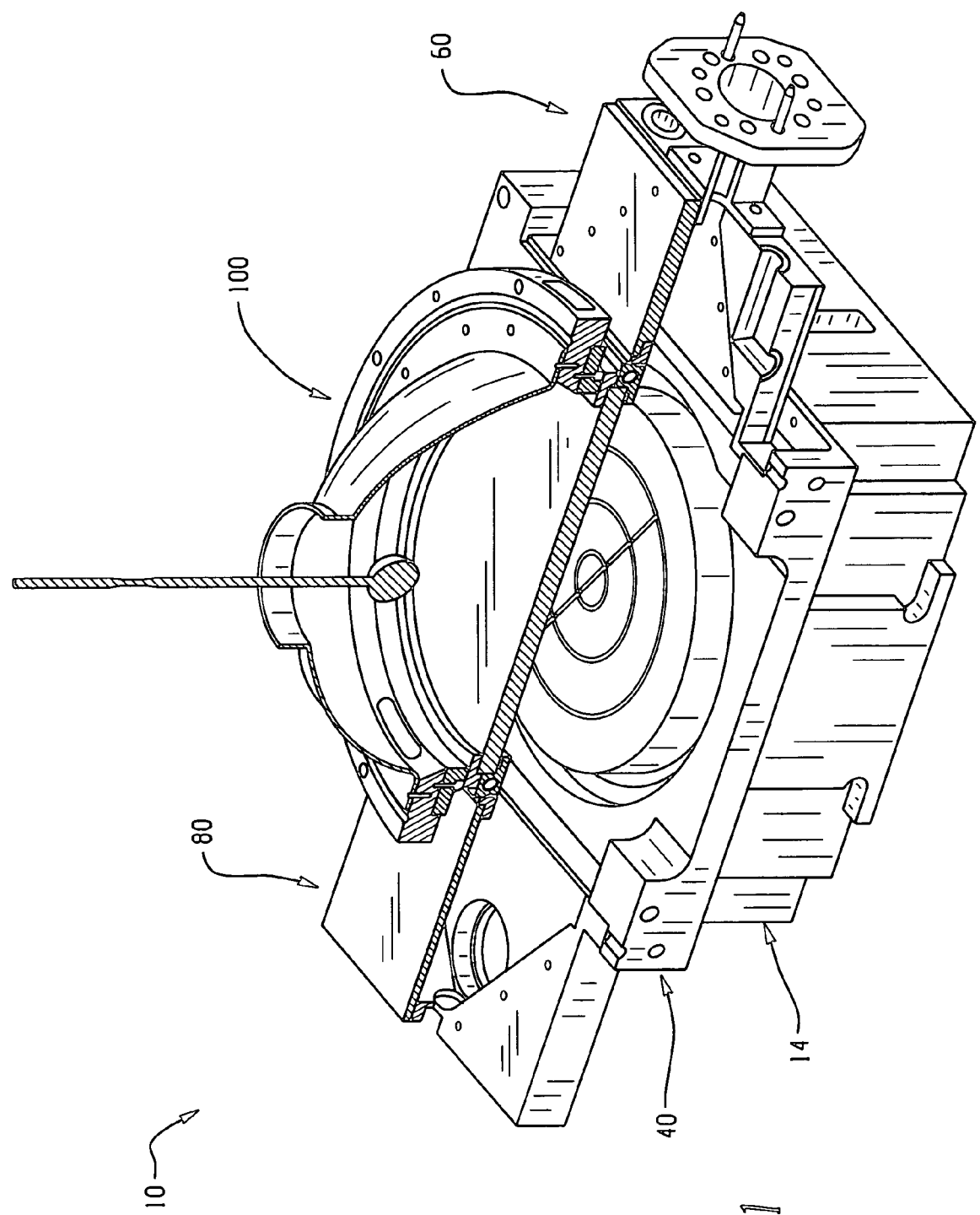
FIG. 1 is a partial perspective view of an exemplary reactor assembly depicting a base unit, a chuck assembly, a process chamber, an inlet manifold assembly, an exhaust manifold assembly, and an optional light source assembly.
Figure 2:
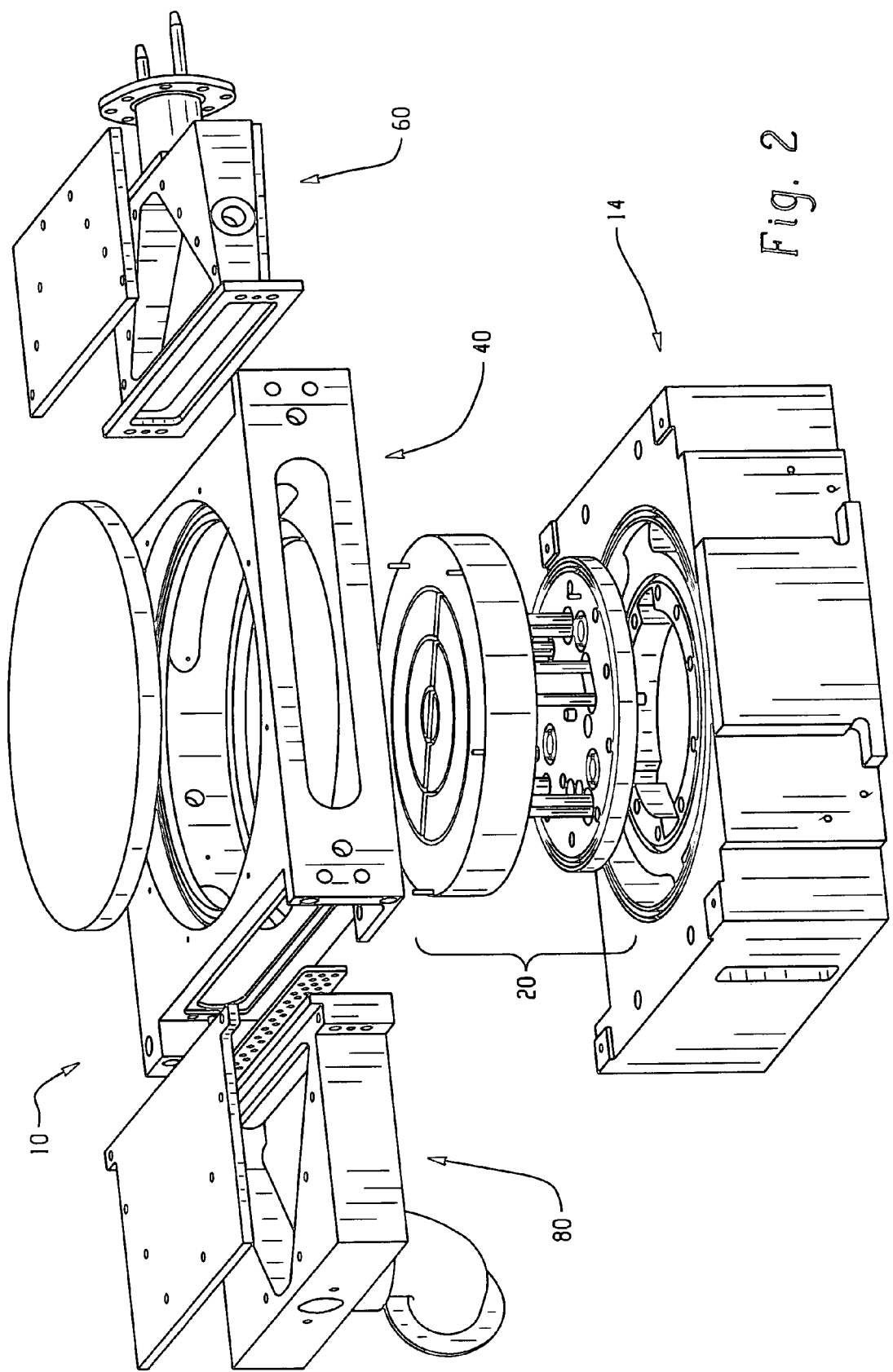
FIG. 2 is an exploded perspective view of the reactor assembly.
Figure 3:
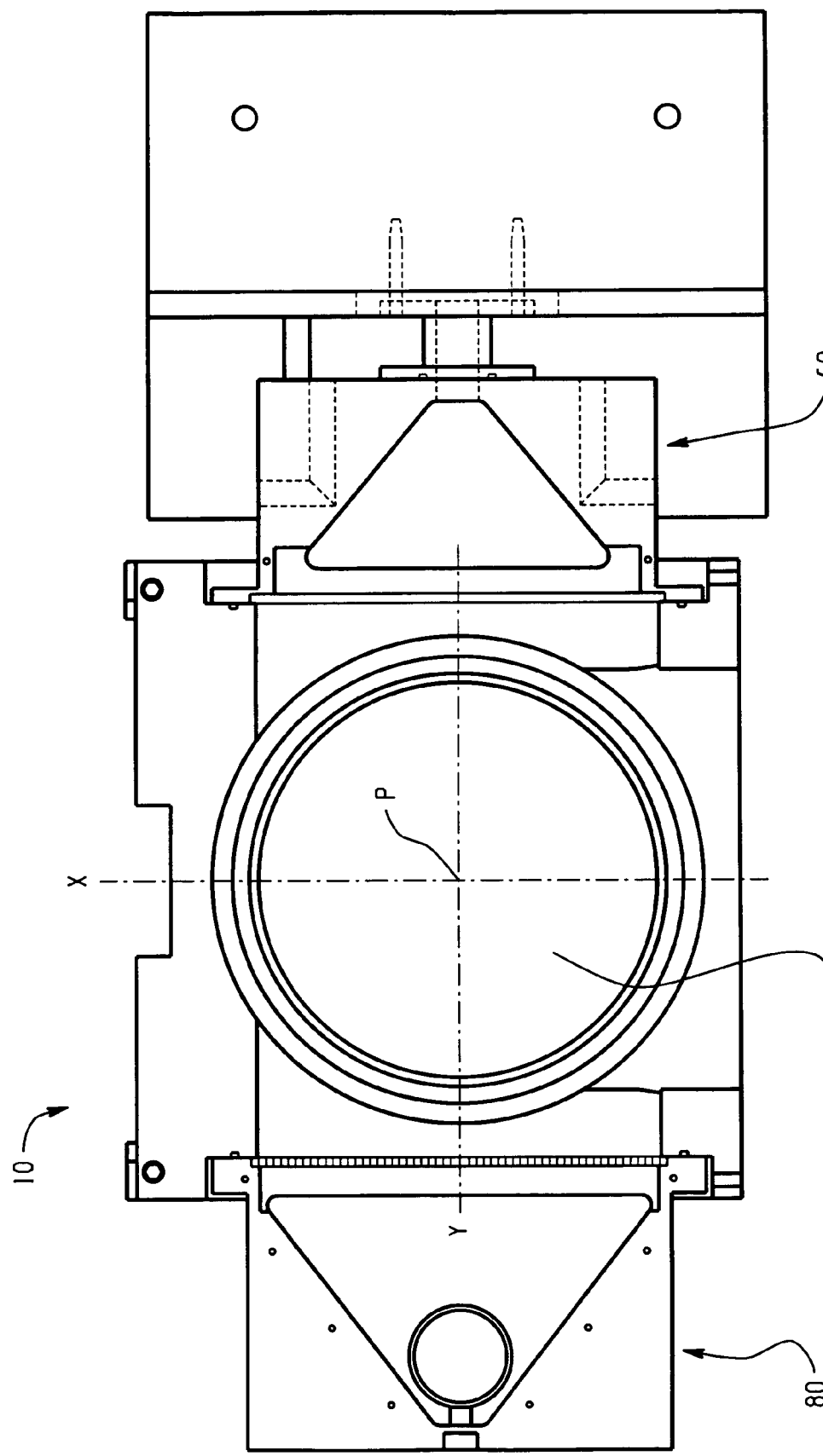
FIG. 3 is a top plan view of the reactor assembly.

Turning now to FIGS. 1 through 3, there is shown an exemplary reactor assembly generally designated 10 for processing a substrate 12. The reactor assembly 10 generally includes a base unit 14, a chuck assembly 20, a processing chamber 40, an inlet manifold assembly 60, and an exhaust manifold assembly 80. FIG. 1 further illustrates an optional light source assembly shown generally at 100. The materials for fabricating these components include metals, ceramics, glasses, polymers, composite materials, and combinations comprising at least one of the foregoing materials. For example, suitable metals include anodized aluminum, and/or stainless steel. Suitable ceramic materials include silicon carbide, or aluminum oxide. It is noted that although the reactor assembly 10 for processing substrates 12 such as wafers is used to illustrate the present disclosure, the reactor assembly 10 can also be utilized for processing other substrates, such as flat panel displays, circuit boards, liquid crystal displays, and the like, as will become apparent to those of ordinary skill in the art in view of this disclosure.

Figure 4:
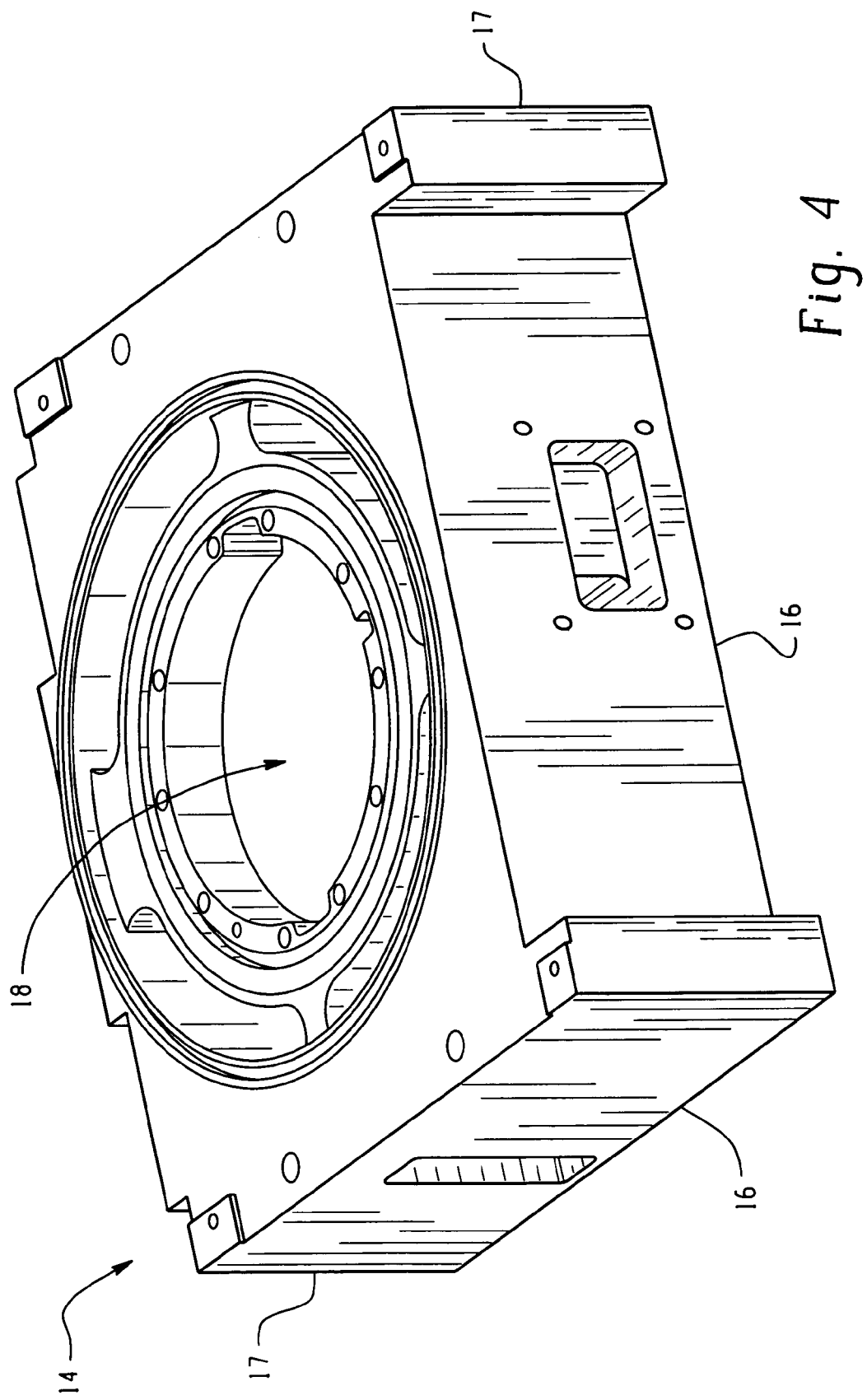
FIG. 4 is a perspective view of the base unit.
Figure 5:
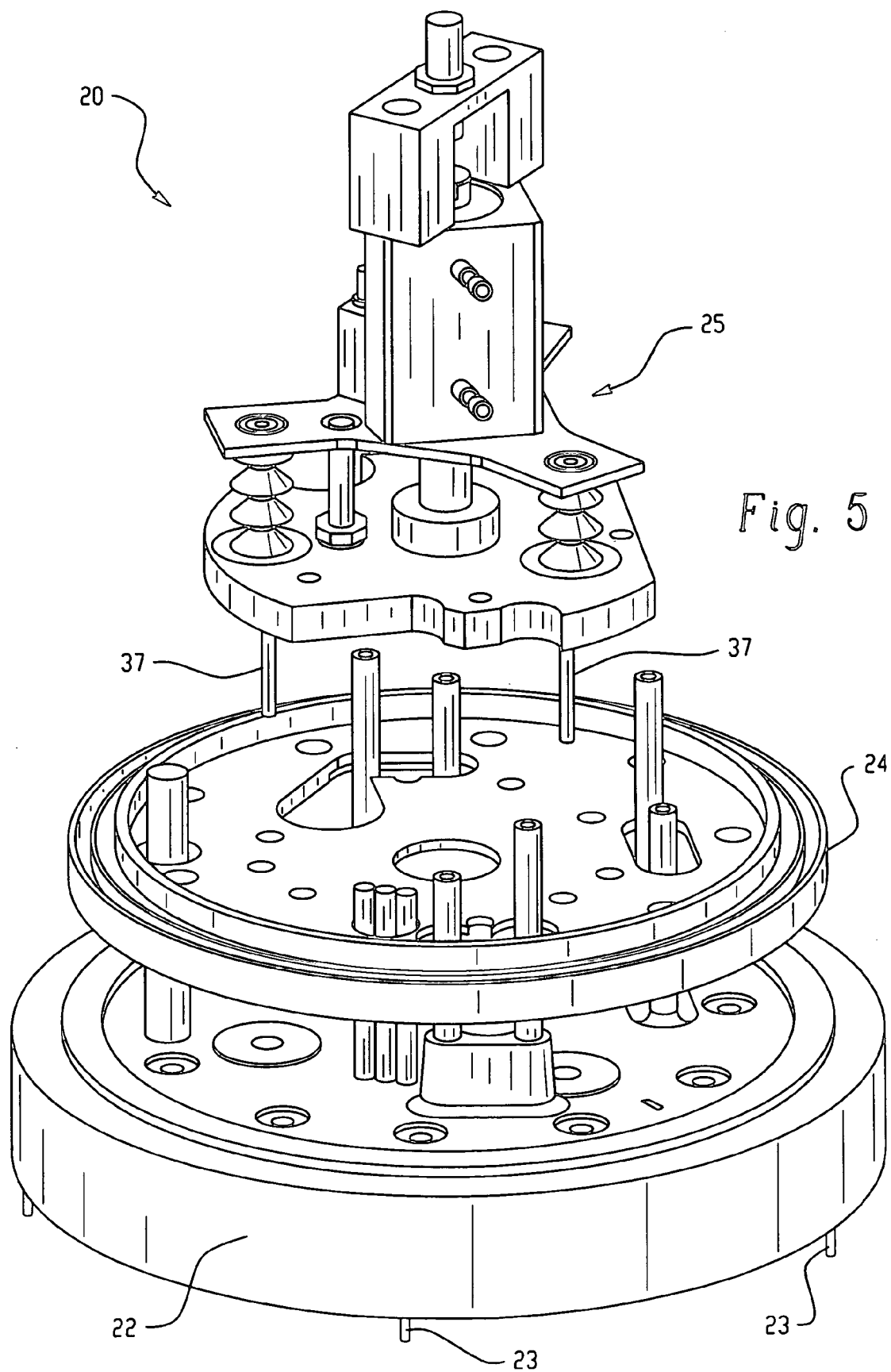
FIG. 5 is an exploded perspective view of the chuck assembly.

As shown in FIG. 4, the base unit 14 includes a bottom wall 16 and sidewalls 17 extending therefrom to form a cavity 18. In one embodiment, the bottom wall 16 of the base unit 14 further includes mechanical coupling means, e.g., connectors, pins, slots, or the like, for attaching the base unit 14 (and reactor assembly 10) to a second reactor assembly, such as for use in a vertical stacked assembly.

FIGS. 5 through 8 illustrate the chuck assembly 20, e.g., an electrostatic chuck assembly, a gravity chuck assembly, or the like. As is generally known to those skilled in the art, the gravity chuck assembly employs gravity as a means for securing the substrate to a support surface such that the substrate is not forced in contact with the support surface by any means other than the weight of the substrate. The chuck assembly 20 is disposed in the cavity 18 of the base unit 14. The chuck assembly 20 generally includes a support 22, an annular isolation ring 24, and a lift pin assembly mechanism 25. The annular isolation ring 24 is sealingly disposed between a lower surface of the support 22 and the base unit 14.

The support 22 includes a planar surface upon which the substrate 12 is placed during processing. The planar surface of the support 22 may optionally include perimeter pins 23. In a preferred embodiment, the support 22 is stationary, i.e., non-rotating. The support 22 preferably includes gas transfer holes 26 and passages 28 extending therethrough such that a heat transfer gas, e.g., helium or the like, can be passed through the holes 26 and/or passages 28 to increase the heat transfer rate between the substrate 12 and surface of the support 22. The holes 26 and/or passages 28 may also be employed for providing a vacuum to the backside of the substrate 12 for increasing the number of contact points between the bottom surface of the substrate 12 and the surface of the support 22 such as by elastic deformation of the substrate. If a vacuum hold down is utilized, the increased number of contact points between the substrate 12 and the surface of the support 22 resulting from the vacuum increases the rate at which the substrate 12 comes to process temperature. In this case, the holes 26 and/or passages 28 are preferably connected to a vacuum line 30, which is in turn connected downstream of a process chamber isolation valve, a flow control valve, or the like (not shown). Advantageously, the decrease in time-to-process temperature reduces the overall process time such as in a bulk photoresist removal process since the reaction rate, e.g., etch rate, is typically a function of the processing temperature.

Figure 8:
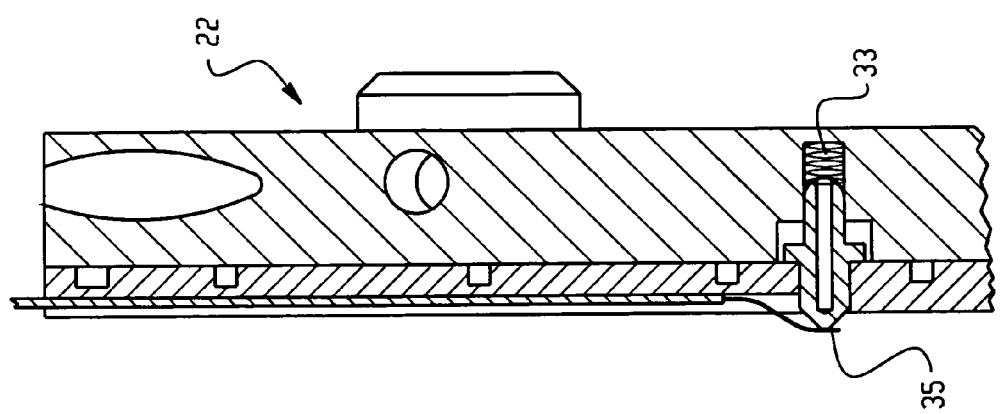
FIG. 8 is an enlarged partial cross-sectional view of the support.
Figure 7:
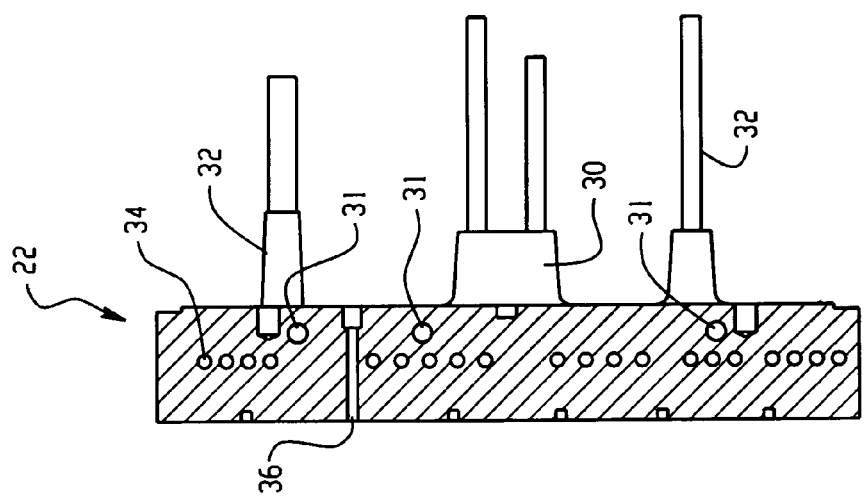
FIG. 7 is a cross sectional view of the chuck assembly taken along the lines A—A of FIG. 6.
Figure 6:
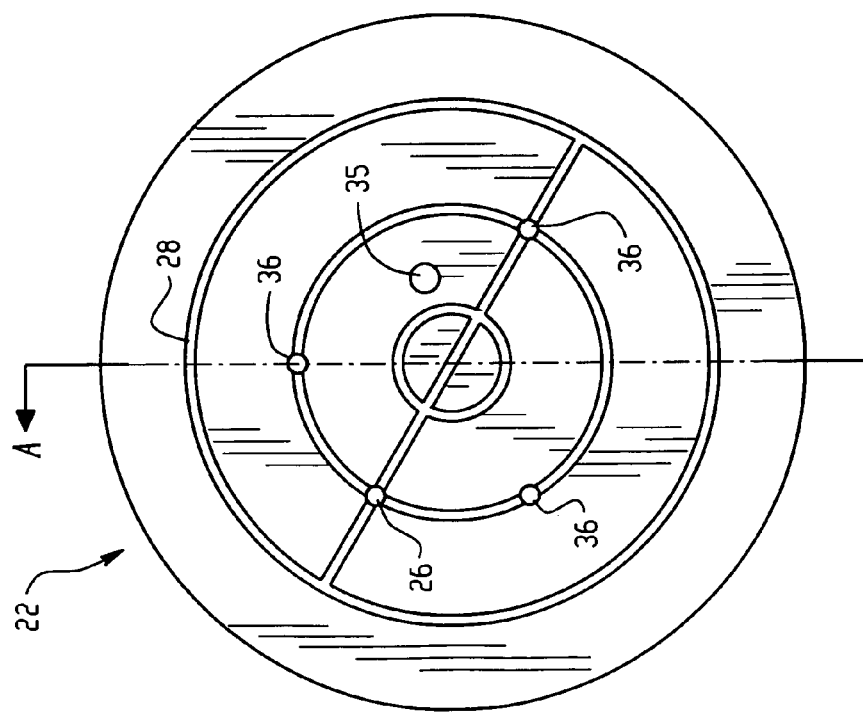
FIG. 6 is a top plan view of the chuck assembly.
Figure 20:
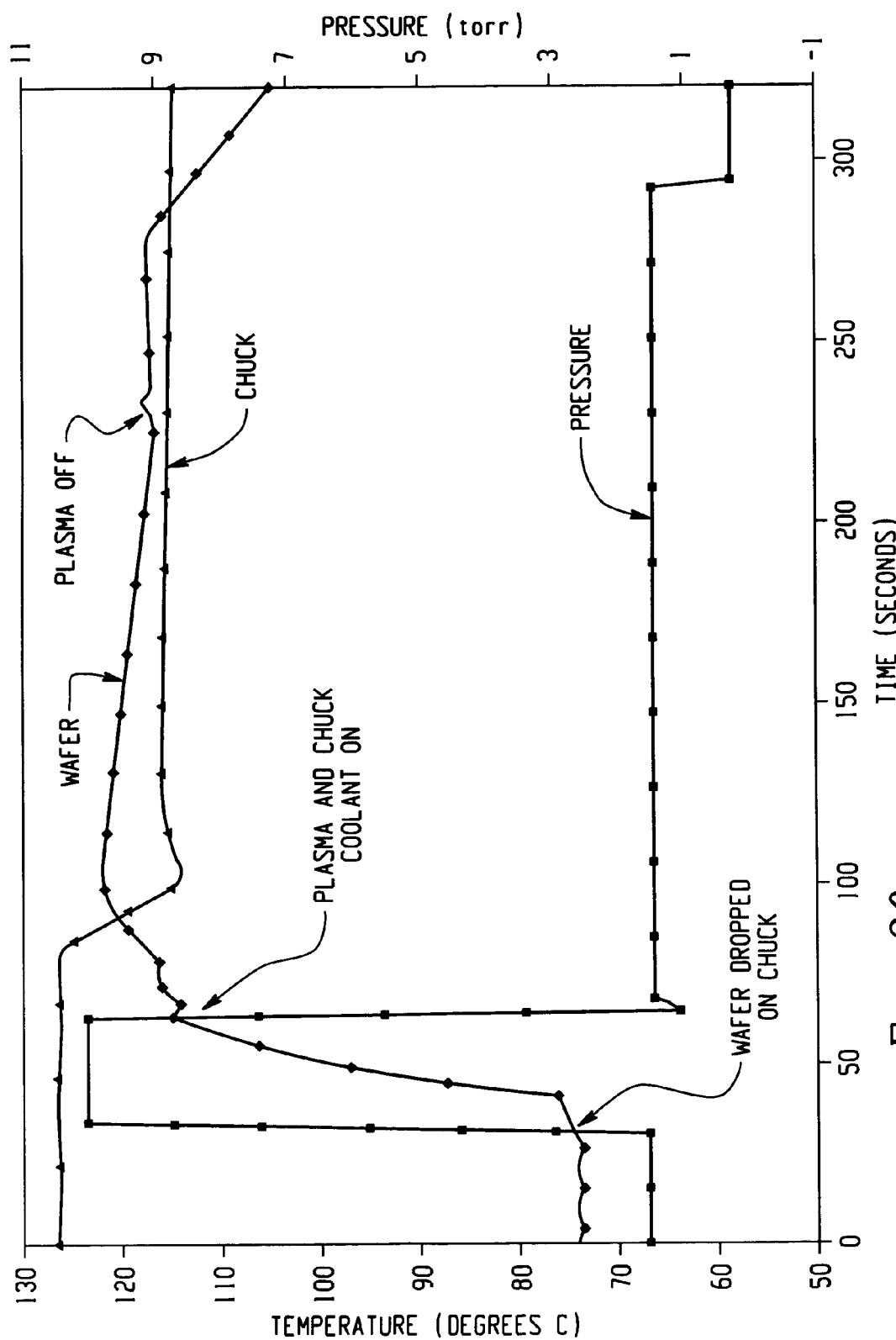
FIG. 20 is a graph depicting wafer temperature, chuck surface temperature, process chamber pressure and time for a plasma process.

Passages 31 (FIG. 7) may also be machined or cast in the support 22 such that a fluid from a cooling system may be circulated to further control the temperature of the substrate 12. In this manner, the fluid is circulated through cooling conduits 32 in fluid communication with the passages 31. Resistance heating elements 34 (FIG. 7) may also be cast into the support 22 enabling elevated processing temperatures that may be utilized for increased tool throughput such as when performing a bulk photoresist strip or etching process. The support 22 preferably has a shape corresponding to that of substrate 12 and is preferably capable of an operating range of about 30° to about 300° C. In a preferred embodiment, the operating temperature of the support 22 can be varied preferably via a feedback or a closed loop control system using a proportional integral derivative (PID) controller having a heating and cooling capability. The controller would alternately supply a current to heating elements 34 or cooling fluid (air or water) to passages 31 in support 22, as needed. Feedback to the PID controller would be provided by measuring the temperature of substrate 12 during the process using a temperature measuring device such as a spring activated thermocouple 35 mounted within the surface of support 22 as shown in FIG. 8. A spring 33 is in operable communication with the thermocouple 35 such that the thermocouple 35 maintains contact with the backside surface of substrate 12. Alternatively, the temperature of support 22 can be controlled with an open loop process (i.e., without a feedback device) by adjusting the current supplied to heating elements 34 and allowing fluid flow (air or water) through passages 31 cast into support 22 at the appropriate point in the process. These methods are exemplary only and allow the substrate 12 to be maintained at a constant temperature as demonstrated in FIG. 20. In FIG. 20, the temperature during processing was maintained at about 120° C. using the closed loop control system. The support 22 is preferably made of a metal resistant to erosion by the process gases, e.g., aluminum with an anodized aluminum oxide coating.

The lift pin mechanism 25 is disposed below the support 22 and includes an air cylinder or the like for actuating lift pins 37 through lift pin holes 36 during processing. Advantageously, the lift pin mechanism 25 is generally confined to the cavity 18 of the base unit 14 to permit vertical stacking of reactor assemblies 10, if desired. The airlines necessary to operate the lift pin mechanism 25 as well as any other plumbing required for the reactor assembly are preferably disposed in a selected one of the sidewalls in the base unit 14.

Figure 9:
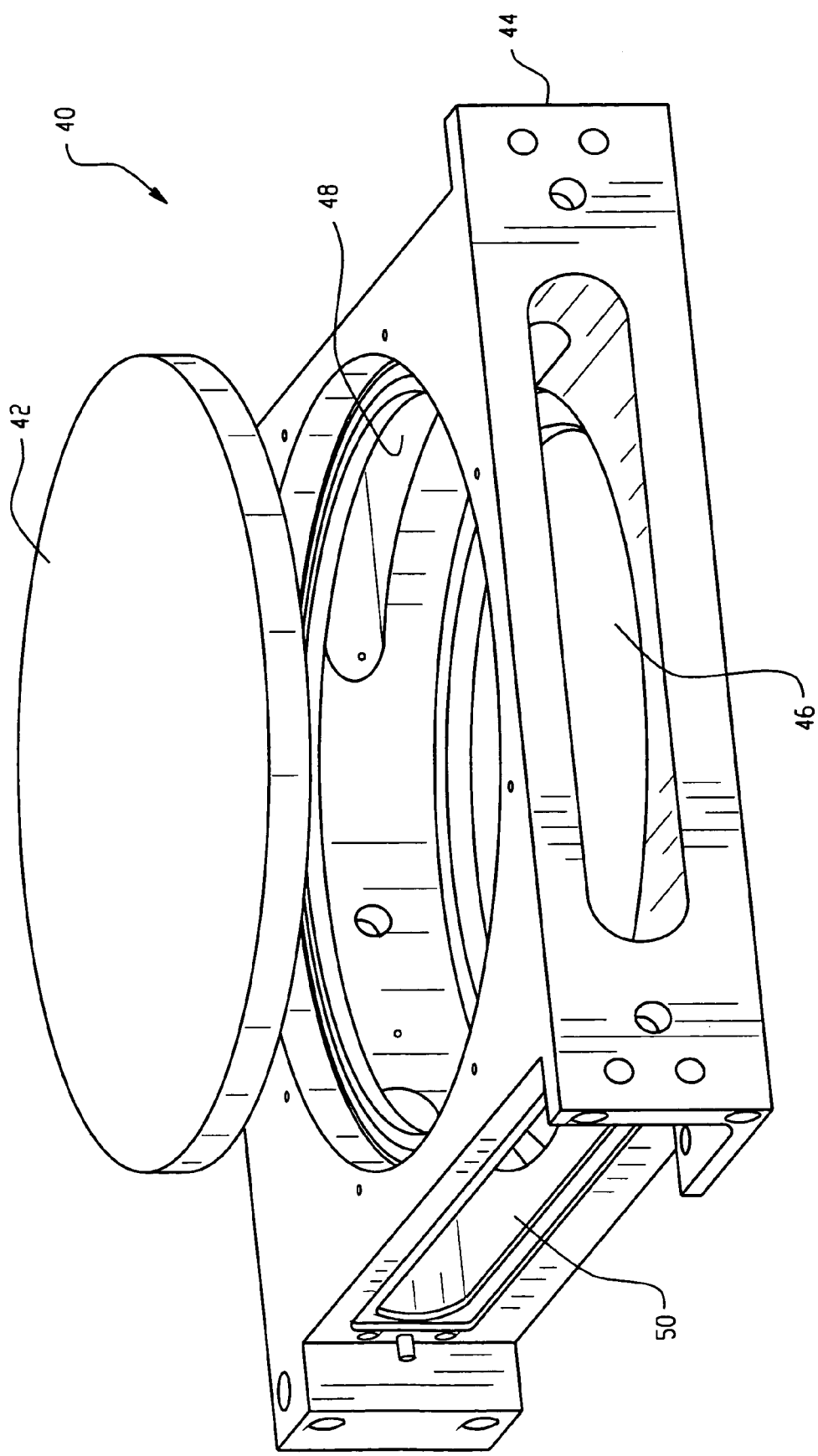
FIG. 9 is a perspective view of the process chamber.

The process chamber 40 is coupled to the base unit 14. As shown more clearly in FIG. 9, the process chamber 40 includes a top wall 42 and sidewalls 44 extending therefrom. The process chamber 40 is preferably fabricated from materials inert to the operating environment including, but not limited to, processing gases, reactants, and reaction byproducts. In a preferred embodiment, the top wall 42 is removable from the sidewalls.

In one embodiment, the top wall 42 is fabricated from a substantially transparent material. In this manner, the optional light source assembly 100 may be disposed above the top wall 42 for projecting light, e.g., infrared, ultraviolet, visible, or the like, into the process chamber 40. For example, in the case of ultraviolet light, the top wall 42 is preferably selected from a material such as quartz and is substantially transparent to ultraviolet light of about 100 nanometers (nm) to about 400 nm, and more preferably from about 130 nm to about 256 nm.

The sidewalls 44 of the process chamber 40 include a plurality of openings. One opening 46 is dimensioned for transferring a substrate 12 into and out of the process chamber 40. Openings 48, 50 are also formed in diametrically opposing sidewalls for providing fluid communication with the inlet manifold assembly 60 and exhaust manifold assembly 80, respectively, as will be discussed in greater detail below. As such, opening 46 for transferring a substrate into and out of the process chamber 40 is in the sidewall adjacent to the sidewalls containing openings 48, 50. Other openings may also be disposed in the sidewalls for purposes generally known in the art such as, for example, an optical port for monitoring endpoint detection in a plasma ashing process, a mass spectrometer inlet for analyzing gaseous species evolved during processing, or the like.

The inlet manifold assembly 60 is attached to the selected one of the sidewalls 44 of the process chamber 40, and as shown in FIGS. 10 through 12, comprises an inlet end portion 62 in fluid communication with a flow-shaping portion 64 for introducing the gas and/or reactants through opening 48 of the process chamber 40. A removable cover 65 (FIGS. 11, 12) is disposed over the flow-shaping portion

64. Optionally, the flow-shaping portion 64 may be formed from one or more components. The inlet end portion 62 is shown as a cylindrically shaped conduit, although other shapes may be employed. The inlet end portion 62 is in fluid communication with a discharge outlet of a conduit that extends from a plasma generator or the like (not shown) for introducing the gas and/or reactants into the process chamber 40. The flow-shaping portion 64 extends laterally outward from the inlet end portion 62 and is in fluid communication with the process chamber 40. Preferably, the flow-shaping portion 64 is triangular or fan-shaped, although other shapes may be employed. In one embodiment, the fluid passageway provided by the flow-shaping portion 64 gradually tapers from an opening height ($H^1$) defined by a diameter of the inlet end portion 62 at one end to a height ($H^2$) defined by opening 68 as shown in FIG. 11. A recess 70 is preferably formed about opening 68 to permit the installation of an optional baffle plate (suitable examples of which are shown in FIGS. 15–18). In this manner, the gas and/or reactants can flow through opening 68 defined by the flow-shaping portion 64, through the baffle plate, if present, and into the process chamber 40. In a preferred embodiment, the inlet manifold assembly 60 does not contain the baffle plate.

The flow-shaping portion 64 is effective to laterally elongate the flow of the gas and/or reactants as it flows from the inlet end portion 62 and into the process chamber 40. As will be discussed in greater detail below, it has been found that the resulting flow pattern flows in a direction about parallel to a plane defined by the substrate surface, i.e., the flow is coplanar to the substrate surface, and at similar gas velocities from the center to the edge of the substrate resulting in improved processing uniformity and unexpectedly increased reactivity.

In a preferred embodiment, a width midpoint position of the flow-shaping portion 64 is aligned or coplanar with the substrate 12. In other words, as shown in FIG. 3, a line Y drawn from the width midpoint of the inlet manifold flow shaping portion 64 to the width midpoint of exhaust manifold exhaust receiving portion 82 is preferably coincident with the long axis of the chuck assembly 20 or alternatively, preferably bisects the substrate 12 along its central axis P. A vertical midpoint position of the flow-shaping portion 64 is preferably at a midpoint of the distance between the surface of the support 22 and the top wall 42 of the process chamber 40.

Figure 13:
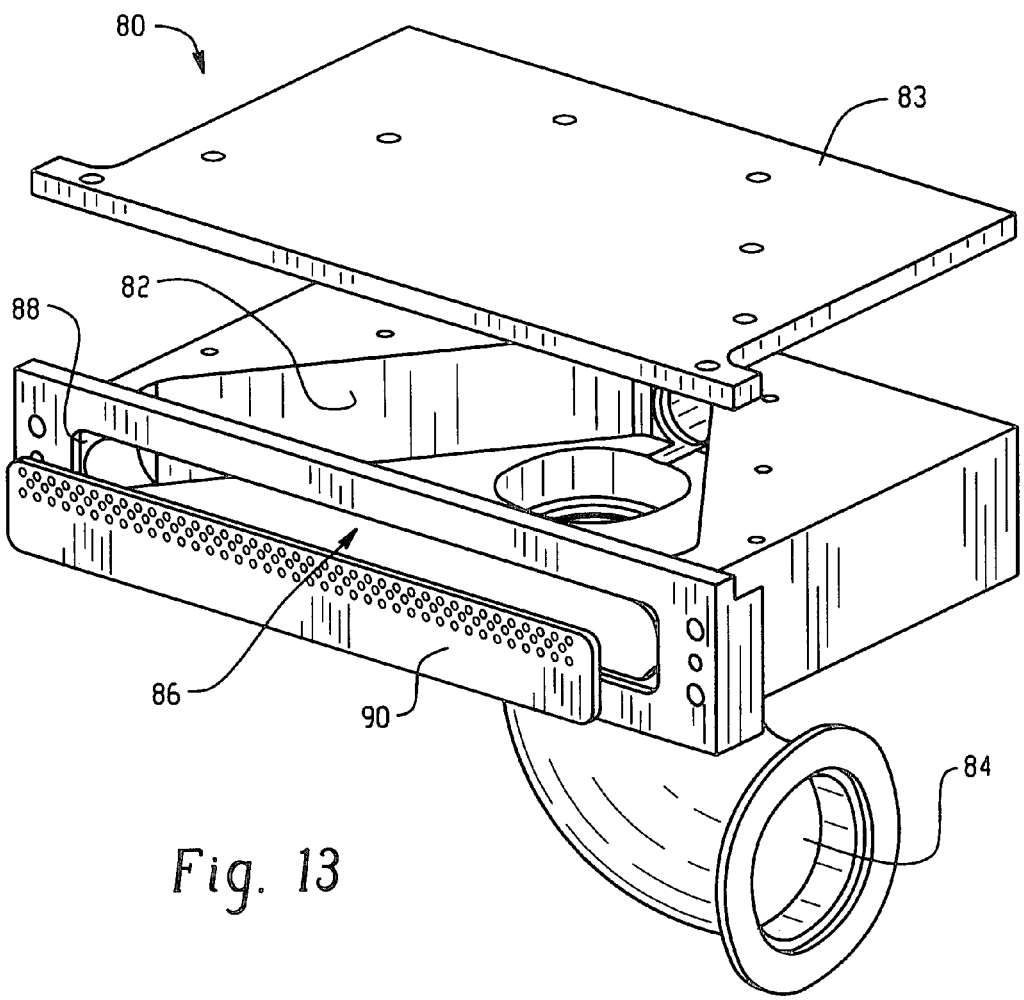
FIG. 13 is an exploded perspective view of the exhaust manifold assembly.
Figure 14:
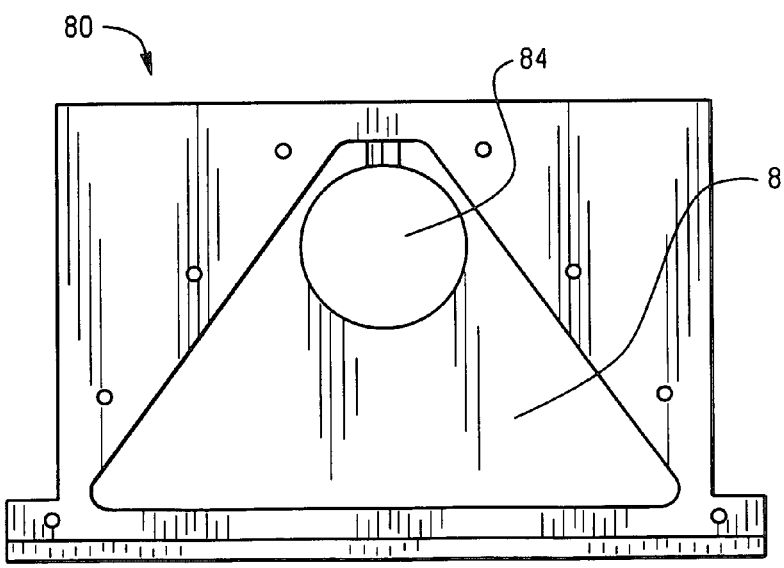
FIG. 14 is a top plan view of the exhaust manifold assembly.
Figure 15:
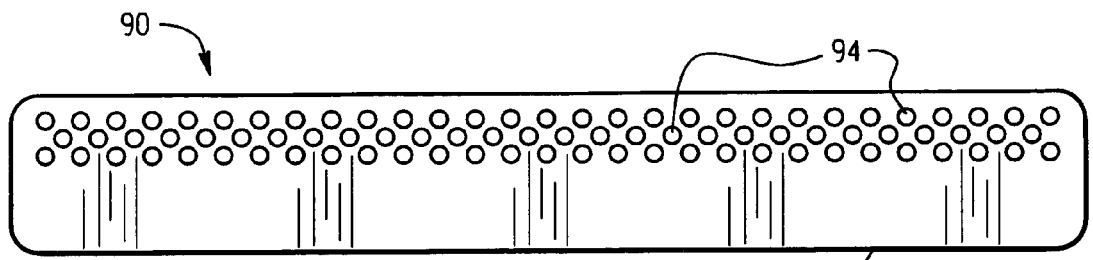
FIG. 15 is a side view of a flow restrictor.
Figure 16:
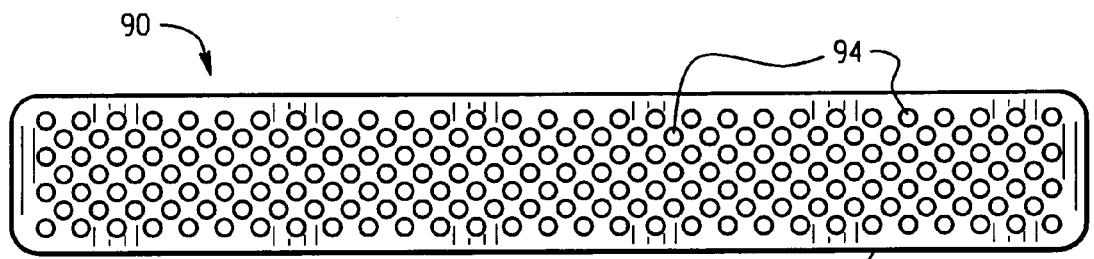
FIG. 16 is a side view of a flow restrictor.
Figure 17:
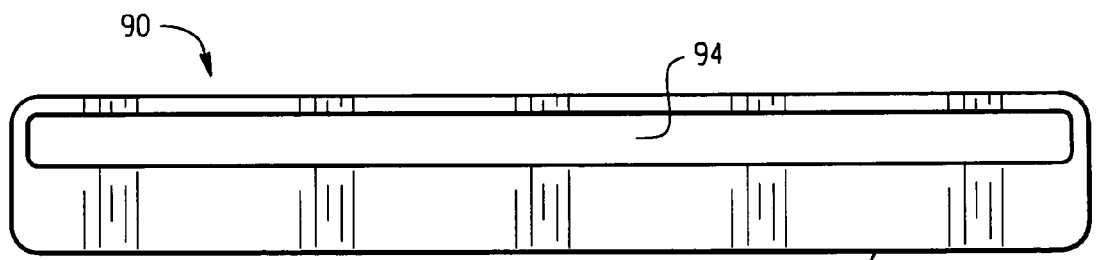
FIG. 17 is a side view of a flow restrictor.
Figure 18:
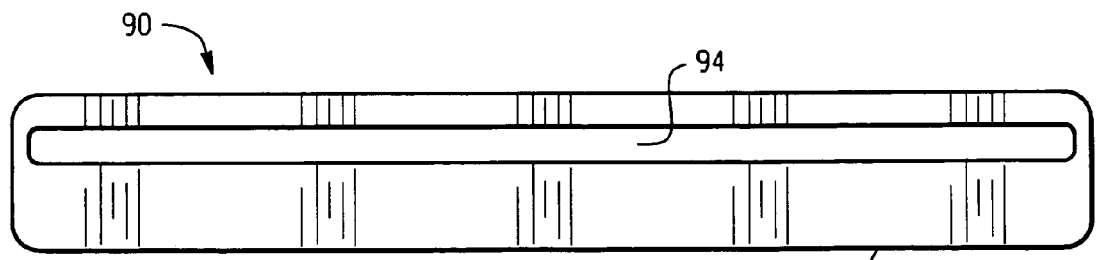
FIG. 18 is a side view of a flow restrictor.

The exhaust manifold assembly 80, attached to the sidewall 44 diametrically opposed from the inlet manifold assembly 60, comprises an exhaust receiving portion 82 and an outlet end portion 84 as illustrated in FIGS. 13 and 14. The exhaust receiving portion 82 is in fluid communication with the opening 50 in the sidewall 44 and extends laterally inward to fluidly communicate with the outlet end portion 84 such that the flow of gas and/or reactants, as well as any byproducts produced during processing flow about parallel to a plane defined by the substrate surface 12. The exhaust receiving portion 82 is preferably triangularly shaped, although other shapes may be employed. A cover 83 is disposed over the exhaust receiving portion 82. A recess 88 is disposed about an opening 86 of the exhaust receiving portion 82 and is preferably dimensioned to receive a flow restrictor generally designated 90, e.g., a baffle plate. Although other shapes may be employed, the outlet end portion 84 is shown as a cylindrical conduit, i.e., the shape of an exhaust conduit typically employed in a standard vacuum process chamber.

The flow restrictor 90 preferably includes a plate 92 having one or more passageways 94 for restricting the flow of the gas, reactants and/or byproducts through the exhaust manifold assembly 80. Exemplary flow restrictors 90 are shown in FIGS. 15–18 and are not intended to be limiting. Preferably, the passageways 94 comprise a plurality of circular openings, although other shapes may be employed, e.g., slots, ovals, square shaped passages, combinations comprising at least one of the foregoing shapes, and the like. Depending on the desired application, the plate 92 may be planar or may have some curvature. In a preferred embodiment, the flow restrictor 90 includes a passageway 94 formed in a selected half of the plate, i.e., disposed in an area confined to less than or equal to about one half of the height dimension of the plate, wherein a length dimension of the plate is greater than the height dimension (e.g., FIG. 15). This allows the flow restrictor 90 to be installed with the passageway 94 oriented above the plane of the substrate or alternatively, rotated 180 degrees and installed such that the effluent from the process chamber 40 exits below the plane of the substrate. In a more preferred embodiment, the lowest passageway or row of passageways is co-planar with the substrate surface, i.e., at or above substrate surface plane. While not wanting to be bound by theory, it is believed that the flow restrictor 90 functions similarly to a porous membrane such that the gas flow velocity though each passageway is substantially the same.

By restricting the flow of gas, reactants and/or byproducts into the exhaust manifold assembly 80 by use of the flow restrictor 90, a pressure differential results between the interior of the process chamber 40 and the exhaust receiving portion 82. It has been found that the presence of this pressure differential improves overall uniformity of the plasma across the substrate surface. Preferably, the pressure differential across the fluid restrictor 90 is greater than about 50 millitorr, with greater than about 300 millitorr more preferred, and with greater than about 500 millitorr even more preferred.

Advantageously, since the flow restrictor 90 is used downstream from the process chamber 40, i.e., after reaction of the reactive species with the substrate 12, the problems associated with reactive species recombination are eliminated. Since the flow restrictor 90 is located downstream, the flow restrictor 90 may be fabricated from anodized aluminum or the like. The use of anodized aluminum or the like is relatively inexpensive compared to the materials (upstream) employed to prevent reactive species recombination, e.g., quartz, alumina, ceramics, specialized aluminum alloys with non-reactive coatings such as hard anodization, and the like. The flow restrictor 90 is preferably mechanically affixed to recess 88.

During operation of the reactor assembly 10, a transfer robot end effector (not shown), or the like, is used to transport the substrate 12 into and out of the process chamber 40 through opening 46. The robot end effector places the substrate 12 onto raised lift pins 37 of the chuck assembly 20. The robot end effector is then retracted from the process chamber 40 and the lift pins 37 are then lowered. In this manner, the substrate 12 is placed in contact with the support 22. In one embodiment, as the substrate 12 approaches the support surface, i.e., as the lift pin mechanism retracts lift pins 37, a high vacuum valve is preferably opened exposing the backside of the substrate 12 to a foreline pressure through the holes 26 and passages 28 in support 22. Depending on the prevailing pressure in the process chamber 40 during substrate transfer, a pressure differential can be created across the substrate 12 to cause a slight elastic deformation to the contour of the support 22. In this manner, thermal contact between the substrate 12 and the support 22 is improved. As a result, substrate temperature ramp rates can preferably be increased up to about 20° C./sec. As the process chamber 40 approaches the desired processing pressure, the differential pressure across the substrate 12 will decrease to a minimum value.

The gas and/or reactants, e.g., a plasma, are then generated in a plasma tube or the like upstream from the process chamber 40 such as with a microwave, RF coil plasma applicator, or the like. The plasma is discharged into the process chamber 40 through the inlet manifold assembly 60. Alternatively, the plasma can be generated in a process chamber adapted for ICP or CCP type processing. For example, the ICP source can include appropriate hardware, such as an induction coil, which would be mounted adjacent to the top wall 42 of the process chamber 40. In the case of a parallel plate type reactor, top wall 42 would be replaced with an upper electrode assembly and chuck assembly 20 would be used as a lower electrode being electrically and thermally isolated from the balance of the reactor assembly by annular isolation ring 24.

Figure 19:
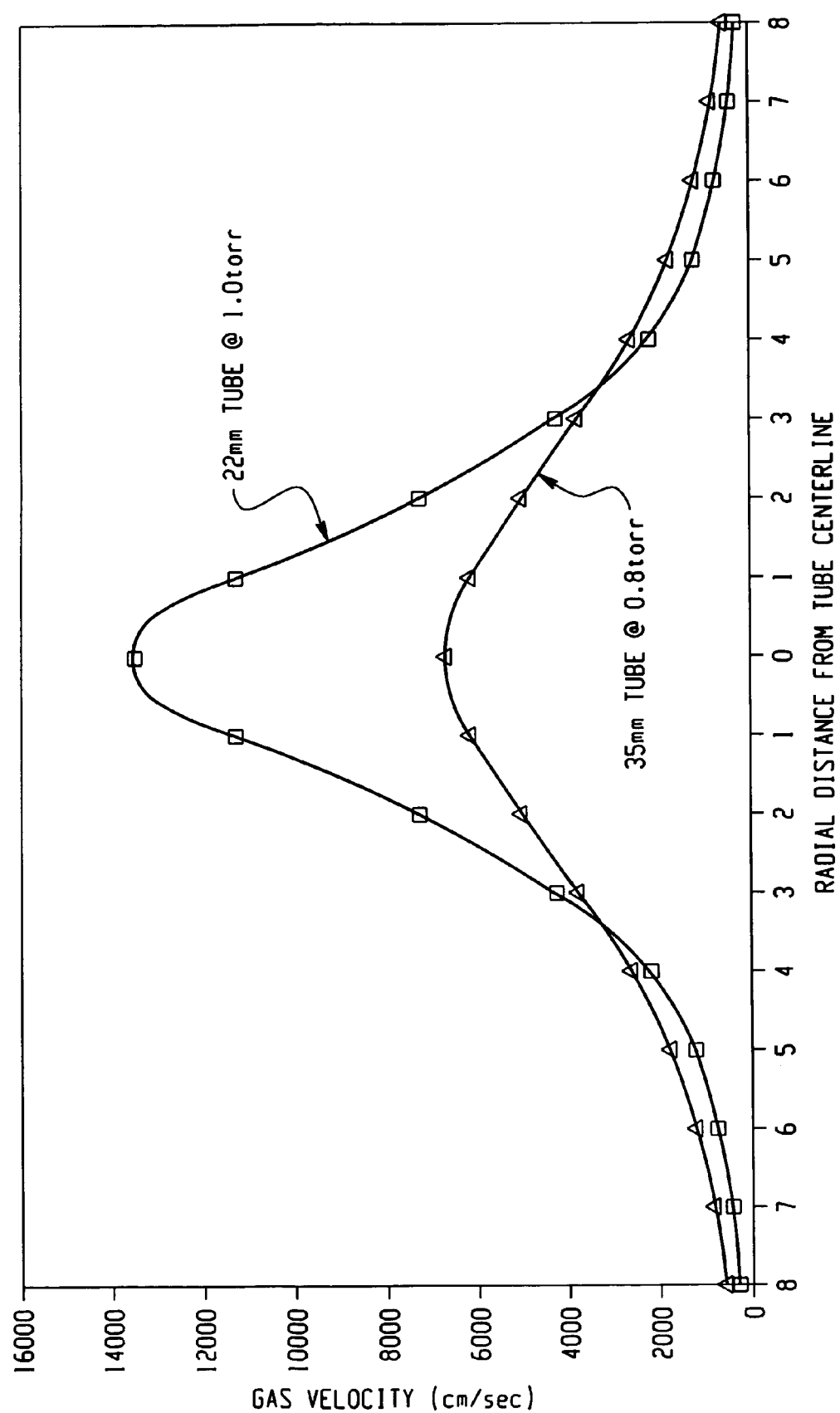
FIG. 19 is a graph depicting a gas velocity as a function of radial distance from a tube centerline for different sized tubes and rarified gas pressures.

The plasma can be described as a viscous flow such that when the plasma flows into the process chamber 40 a parabolic laminar flow pattern is developed, wherein the highest gas velocity (Vmax) is found in the centermost portion of the flow pattern and the lowest velocity (V=0) is found at the outermost portion of the flow pattern, i.e., along the walls of the inlet end portion 62 of the inlet manifold assembly 60. As the plasma enters the flow-shaping portion 64 of the inlet manifold assembly 60, the gas centerline velocity begins to decay while maintaining the substantially parabolic laminar flow pattern as shown in FIG. 19. The plasma then flows into the process chamber 40 and across the substrate surface 12. The reaction effluent then leaves the process chamber 40 through the exhaust manifold assembly 80 diametrically opposed from the inlet manifold assembly 60, thereby providing a constant laminar flow across the substrate surface 12. It has been found that velocity, pressure, and other fluid properties at each point along the substrate cross-section in the laminar flow remain relatively constant. In this manner, uniform residence time of gas and/or reactive species is maintained on the substrate surface. Moreover, since the inlet manifold assembly 60 and exhaust manifold assembly 80 are symmetrically located, cross flow uniformity is improved.

FIG. 19 illustrates gas velocity profiles for differently sized inlet opening portions 62 of the inlet manifold assembly 60. The inlet end portion 62 having a conduit diameter of 35 millimeters (mm) provided increased velocity uniformity across the substrate compared to a conduit diameter of 22 mm. The difference in center-to-edge gas velocity is reduced by a factor of 2.5 with the larger tube diameter and lower processing pressure. The results indicate that large gas inlet openings and lower pressures generally aid in reducing process non-uniformity. Moreover, the use of the flow restrictor 90 in combination with lower processing pressures lowers the centerline gas velocity by creating a plenum effect within the process chamber 40. This combination allows for better spatial distribution of reactants within the process chamber 40 and results in a substantially uniform velocity in the Y direction (FIG. 3) upon reaching the passageways provided by the flow restrictor 90. With process pressures ranging from 0.8 torr to 1.5 torr and mass flow rates from 2.5 to 3.5 standard liters per minute, residence time in the process chamber 40 is surprisingly low, aiding in the rapid removal of effluents from the reaction surface and minimizing the dilution of reactants in the region immediately preceding the flow restriction.

The reactor assembly 10 is not intended to be limited to any particular semiconductor processing tool and is applicable to plasma-generating tools employing radio frequency energy, microwave energy or other high frequency energy sources, individually or in combination, to generate the plasma. The operating pressures within the process chamber 40 are preferably about 100 millitorr to about 3 torr, with about 200 millitorr to about 2 torr more preferred, and with about 500 millitorr to about 1.5 torr even more preferred. Moreover, the process chamber 10 may further include additional features depending on the application. For example, a quartz window may be installed and a UV light source may be placed in proximity to the wafer. Such a non-columnar light source may have a wavelength similar to UV excimer lasers that have been shown to enhance photoresist removal in bulk strip applications and as such, could be used in parallel with microwave plasma generated reactive gases. Moreover, pre- and post-photoresist strip exposure to the light source could also provide residue removal and implanted resist removal advantages. Overhead RF sources, optical ports, gas analyzers, additional light sources, and the like could also be used either independently, or in combination, with the process chamber 40 providing an extremely flexible process platform.

The following examples are presented for illustrative purposes only, and are not intended to limit the scope of the disclosure.

EXAMPLE 1

In this example, a bulk strip photoresist removal process was employed in a plasma asher employing a cross flow reactor assembly and compared to conventional axial flow reactor assemblies constructed for the same application. Substrates were coated with photoresist and exposed to the bulk photoresist removal process. The axial flow plasma reactor assemblies included a GES plasma asher and an MCU plasma asher, both of which are commercially available from the Axcelis Technologies Corporation. The cross flow reactor assembly included the use of a flow restrictor disposed in the exhaust manifold assembly as previously described. The flow restrictor employed was a planar plate having a circular passageway configuration similar to the flow restrictor shown in FIG. 15. The flow restrictor was installed in the recess 88 of the exhaust manifold assembly 80 with the passageway pattern oriented toward the top of the process chamber 40 such that the lower row of circular passageways was coplanar with the substrate surface. The substrate temperature was maintained relatively constant at 120° C. and 270° C.

The process employed in the cross flow reactor assembly included flowing 3200 sccm oxygen, 300 sccm forming gas (5% hydrogen in nitrogen) at a pressure of 1.5 torr at 1500 watts microwave power. Contributions associated with photoresist shrinkage at 270° C. were subtracted from the ash rate at that temperature. The process recipes for both the MCU and GES reactor assemblies were optimized to provide the best performance. The ashing removal rates are shown in Table 1.

TABLE 1

| | Ashing Rate 120° C. (microns/minute) | Ashing Rate 270° C. (microns/minute) | % Process non-uniformity at 120° C. | % Process non-uniformity at 270° C. |
|---|---|---|---|---|
| Cross Flow Reactor | 0.211 | 6.9 | 7.5 | 11.9 |

TABLE 1-continued

| | Ashing Rate 120° C. (microns/ minute) | Ashing Rate 270° C. (microns/ minute) | % Process non-uni- formity at 120° C. | % Process non-uni- formity at 270° C. |
|---|---|---|---|---|
| *Axial Flow (GES Plasma Asher) | 0.117 | 2.8 | 6.0 | 3.0 |
| *Axial Flow (MCU Plasma Asher) | 0.123 | 2.0 | 11 | 12 |

*Comparative Examples

In the bulk strip photoresist removal process using the cross flow reactor configuration, the results unexpectedly showed an increase in the number of active species available for surface reaction with the photoresist as demonstrated by the increased ashing rate relative to the MCU and GES axial flow reactors. The ashing rate was about 2 times or more greater compared to the axial flow process chamber configurations using the same process conditions, process gases, photoresist, and substrate types. The observed reaction rates for the cross flow reactor were surprisingly greater than reaction rates typically observed in axial flow reactors using fluorine process chemistries such as $CF_4$ and other fluorine containing compounds generally used in combination with $O_2$ to increase the reaction rates. Advantageously, the process uniformity of the cross flow process chamber configuration was substantially equivalent to the axial flow reactor assemblies.

Advantageously, the use of the cross flow process chamber permits the reaction to proceed at a faster rate than conventional axial flow reactor, while providing control of the substrate temperature as demonstrated by the wafer temperature profile for a 120° C. ashing process shown in FIG. 20. Since chamber volume is relatively small in the cross flow configuration, residence time is minimized. Moreover, the lack of a baffle plate at the gas inlet advantageously reduces the effect of recombination of active species by reducing the surface area in contact with the gas and reducing pressure variations upstream of the wafer. Other advantages include, but are not limited to, elimination of parasitic wafer heating or so-called "first wafer" effects normally found in baffle plate equipped axial flow reactors; higher strip rates than conventional axial flow reactors; lower manufacturing costs due to a simpler design; elimination of quartz or aluminum alloys and coatings used for inlet gas distribution; and smaller footprint due to the decreased size and vertical height. The reactor assembly is versatile and can be readily adapted for a variety of applications. The removable top wall of the process chamber permits easy access to the interior of the process chamber for repair, for cleaning, and the like. Moreover, the use of a transparent top wall allows the user to employ a light source. Still further, as previously noted, one or more reactor assemblies may be vertically stacked, thereby allowing multiple substrate processing capabilities with minimal impact on footprint.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A reactor assembly comprising:
a base unit;
a chuck assembly disposed in a cavity of the base unit, wherein the chuck assembly comprises a support having a surface capable of receiving a substrate;
a process chamber comprising a top wall, a bottom wall, and sidewalls extending therefrom substantially perpendicular to the support surface of said chuck assembly, and a cylindrical opening extending through the bottom wall to the top wall defining a substantially cylindrically shaped interior region having a central axis extending substantially perpendicular to the support surface of said chuck assembly, wherein the process chamber is coupled to the base unit;
an inlet manifold assembly in fluid communication with a first sidewall opening of the process chamber in a selected one of the sidewalls, wherein the inlet manifold assembly comprises a triangularly shaped flow-shaping portion adapted to laterally elongate a gas and/or a reactant flow into the process chamber, wherein the fluid communication between the inlet manifold assembly and the first sidewall opening of the process chamber is free from a baffle plate; and
an exhaust manifold assembly in fluid communication with a second sidewall opening of the process chamber in the sidewall diametrically opposed from the selected one of the sidewalls, wherein the first and second sidewall openings define an entire flow path of the gas and/or the reactant flow into and out of the process chamber.

2. The reactor assembly according to claim 1, wherein the flow-shaping portion of the inlet manifold assembly is adapted to introduce the gas and/or reactant flow into the process chamber at about a plane parallel to a surface of the substrate.

3. The reactor assembly according to claim 1, wherein the top wall of the process chamber is removable.

4. The reactor assembly according to claim 1, wherein a bottom wall of the base unit is adapted to be stackedly attached to a second reactor assembly.

5. The reactor assembly according to claim 1, wherein the exhaust manifold assembly is adapted to receive the gas and/or reactant flow from the process chamber at about a plane parallel to the surface of the substrate.

6. The reactor assembly according to claim 1, wherein the exhaust manifold assembly comprises an exhaust receiving portion and a flow restrictor, wherein the flow restrictor is affixed to an opening of the exhaust receiving portion and is adapted to restrict the gas and/or reactant flow through the opening from the process chamber into the exhaust receiving portion.

7. The reactor assexubly according to claim 1, wherein the support of the chuck assembly comprises a means for regulating a temperature of the substrate.

8. The reactor assembly according to claim 1, wherein the support further comprises a resistance heating element and a cooling passage.

9. The reactor assembly according to claim 1, wherein the support of the chuck assembly is stationary and non-rotating.

10. The reactor assembly according to claim 1, wherein the inlet manifold assembly further comprises a flow restrictor attached to an opening of the flow-shaping portion.

11. The reactor assembly according to claim 1, wherein the top wall is substantially transparent to a light source.

12. The reactor assembly according to claim 1, wherein the top wall is substantially transparent to a UV light source.

13. The reactor assembly according to claim 1, wherein the top wall is substantially transparent to an infrared light source.

14. The reactor assembly according to claim 1, wherein the process chamber includes a third sidewall opening in the sidewall adjacent to the first and second sidewall openings, wherein the third opening is sized for transporting the substrate into an interior region of the process chamber.

15. The reactor assembly according to claim 1, further comprising a baffle plate disposed about an opening of the flow-shaping portion.

16. The reactor assembly according to claim 6, wherein the exhaust receiving portion is triangularly shaped.

17. The reactor assembly according to claim 6, wherein the flow restrictor comprises a plate having at least one passageway.

18. The reactor assembly according to claim 6, wherein the flow restrictor comprises a rectangularly shaped plate having a length dimension greater than a height dimension, wherein the passageway is disposed in an area less than or equal to about one half of the height dimension.

19. The reactor assembly according to claim 6, wherein the flow restrictor comprises anodized aluminum.

20. The reactor assembly according to claim 1, wherein the inlet manifold assembly is adapted to introduce the gas and/or reactants at about a plane parallel to a surface of the substrate and the exhaust manifold assembly is adapted to exhaust the gas and/or reactants at about a plane parallel to a surface of the substrate.

21. A reactor assembly comprising:
a base unit;
a chuck assembly disposed in a cavity of the base unit, wherein the chuck assembly comprises a support having a surface capable of receiving a substrate;
a process chamber comprising a transparent top wall, a bottom wall, and sidewalls extending therefrom, and a cylindrical opening extending through the bottom wall to the top wall to define a substantially cylindrically shaped interior region, wherein the process chamber is coupled to the base unit;
a light source assembly in operable communication with the transparent top wall for projecting radiation into the process chamber;
an inlet manifold assembly in fluid communication with a first sidewall opening of the process chamber in a selected one of the sidewalls, wherein the inlet manifold assembly comprises a triangularly shaped flow-shaping portion adapted to laterally elongate a gas and/or a reactant flow into the process chamber, wherein the fluid communication between the inlet manifold assembly and the first sidewall opening of the process chamber is free from a baffle
an exhaust manifold assembly in fluid communication with a second sidewall opening of the process chamber in the sidewall diametrically opposed from the selected one of the sidewalls, wherein the first and second sidewall openings define an entire flow path of the gas and/or the reactant flow into and out of the process chamber.

22. The reactor assembly of claim 21, wherein the light source assembly comprises a housing and a Light source.

23. The reactor assembly of claim 21, wherein the top wall comprises a quartz material.

24. The reactor assembly of claim 21, wherein the exhaust manifold assembly is adapted to receive the gas and/or reactant flow from the process chamber at about a plane parallel to a surface of the substrate.

25. The reactor assembly of claim 21, wherein the transparent top wall is removable.

* * * * *